United States Patent [19]

Suzuki

[11] Patent Number: 4,458,221
[45] Date of Patent: Jul. 3, 1984

[54] SURFACE ACOUSTIC WAVE FILTER

[75] Inventor: Hitoshi Suzuki, Yokohama, Japan

[73] Assignee: Tokyo Shibaura Denki Kabushiki Kaisha, Kanagawa, Japan

[21] Appl. No.: 409,040

[22] Filed: Aug. 18, 1982

[30] Foreign Application Priority Data

Sep. 11, 1981 [JP] Japan .................. 56-142484

[51] Int. Cl.³ .................. H03H 9/64; H03H 9/145
[52] U.S. Cl. .................. 333/196; 29/25.35; 310/313 C; 333/195
[58] Field of Search .................. 333/150–154, 333/193–196; 310/313 R, 313 A, 313 B, 313 C, 313 D; 29/25.35

[56] References Cited

U.S. PATENT DOCUMENTS 3,633,132 1/1972 Hartemann .................. 310/313 C
3,663,899 5/1972 Dieulesaint .................. 333/196

FOREIGN PATENT DOCUMENTS 5636604 2/1974 Japan .
52-135646 5/1976 Japan .
53-94155 1/1977 Japan .

Primary Examiner—Marvin L. Nussbaum
Attorney, Agent, or Firm—Banner, Birch, McKie & Beckett

[57] ABSTRACT

A high-performance surface acoustic wave filter is provided having a relative band width greater than 0.2, a shape factor less than 1.5, and a flat group delay time characteristic. The filter has input and output transducers, each with overlapped interdigital electrode fingers, spaced on the surface of a piezoelectric substrate, including an apodized transducer and a second transducer. The envelope of the overlapped portions of the electrode fingers in the apodized transducer includes a main lobe and a plurality of side lobes. The height of side lobes of the apodized transducer which are located farther from the second transducer is greater than the height of side lobes nearer the second transducer. The heights of corresponding side lobes on opposite sides of the main lobe are mathematically related.

11 Claims, 13 Drawing Figures

F I G. 5
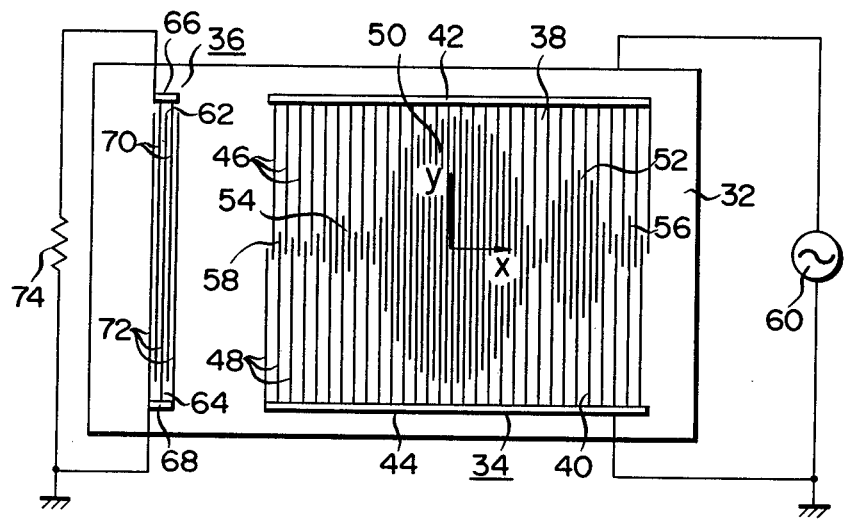
F I G. 6
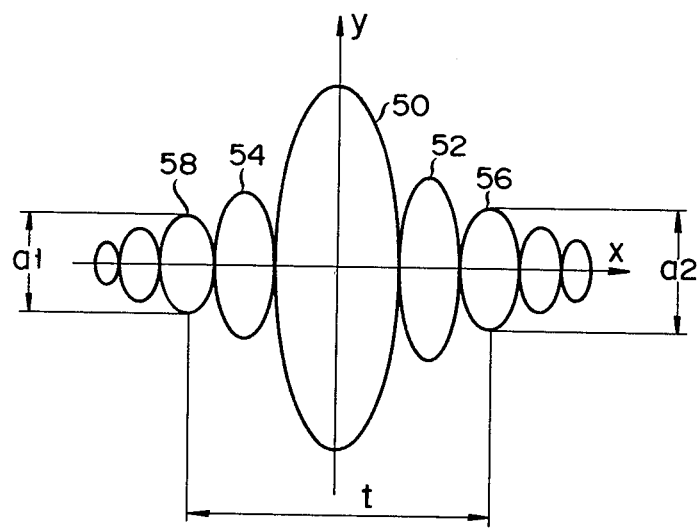

SURFACE ACOUSTIC WAVE FILTER

BACKGROUND OF THE INVENTION

This invention relates to a surface acoustic wave filter (hereinafter SAW filter) for filtering electrical signals and especially to a high-performance, wide band SAW filter.

Various kinds of SAW filter have been widely used in different kinds of electronic equipment. With conventional SAW filter manufacturing techniques, however, it has been difficult to manufacture a high-performance, wide band SAW filter such as a vestigial side band (VSB) filter for a television transmitter. The VSB filter, for example, is required to have a flat frequency amplitude (transfer) characteristic (see curve A in FIG. 1) over a large relative band width, a flat group delay time characteristic (see curve B), and a shape factor close to 1 as shown in FIG. 1. Shape factor is defined as the ratio of the $-30$ dB bandwidth to the $-3$ dB bandwidth, 0 dB being the attenuation at the central frequency $f_o$. The closer to 1 the shape factor becomes, the more sharply the characteristic rises and falls. Group delay T is defined by the following equation $$T = dp/df \qquad (1),$$

where p is the phase difference (in Hz) between a given wave and waves at the central frequency $f_o$, and f is frequency in Hz. Ideally, T should be constant (flat) over the filter's pass band. Relative band width is the ratio of the $-3$ dB bandwidth to the central frequency $f_o$.

The inventors of the present invention attempted to design such a VSB filter having as an input transducer in an interdigital comb-like transducer in which the lengths of the overlapped portions of electrode fingers are varied in accordance with their location along the direction of surface wave propagation. The conventional design technique is as follows:

(1) Establish a desired transfer characteristic, for example as shown in FIG. 1.

(2) Determine the inverse Fourier transform of this transfer characteristic, i.e., the desired impulse response of the filter, for example as shown in FIG. 2.

(3) Arrange the electrodes in the form of this desired impulse response, as shown in FIG. 3.

FIG. 3 shows an example of a SAW filter designed according to the conventional apodizing method. In FIG. 3 is shown a filter which has a normal transducer 12 and an apodized transducer 14, both of which are mounted on a piezoelectric substrate 16. An apodized transducer with a plurality of electrode fingers arrayed at an equal pitch (spacing) is used as the input transducer, while a normal transducer, also with a plurality of equally-spaced electrode fingers, is used as the output transducer.

When the impulse response of this conventionally-designed filter was measured, it was found to be asymmetrical from right to left, as shown in FIG. 4, where the horizontal and vertical axes represent time and voltage respectively. The distinctive feature of the result of this measurement was that the maximum amplitudes of the right-hand side lobes 24 were smaller than those of the corresponding left-hand side lobes 22. If one compares, for example, the maximum amplitudes A1 and A2 of corresponding side lobes $22_2$ and $24_2$, which are the second lobes from main lobe 26, he notes that A1 is larger than A2. For any such corresponding pair of side lobes, the left-hand side lobes were the larger. These results mean that the filter designed according to the conventional design procedure did not match the required transfer characteristic shown in FIG. 1, for it is known to one skilled in the art that if the impulse response waveform of the filter is asymmetrical, a flat group delay time characteristic cannot be obtained, and if the pitches of the points where the waveform of the impulse response intersects the horizontal axis are not uniform, the transfer characteristic will not be flat. (The pitches of the intersections correspond to the pitches of electrode fingers of the transducer.)

SUMMARY OF THE INVENTION

It is therefore an object of the invention to provide a high-performance SAW filter with a flat transfer characteristic over a large relative band width, a shape factor close to 1, and flat group delay time characteristic.

It is a specific object of the invention to provide a wide-band SAW filter with a symmetrical impulse response.

The present invention provides a high-performance surface acoustic wave filter with a relative bandwidth greater than or equal to 0.2, a shape factor less than or equal to 1.5, and a flat group delay time characteristic.

The filter comprises first and second interdigital transducers spaced from each other on the surface of piezoelectric substrate. At least the first transducer further comprises first and second electrodes, and each electrode includes a common terminal and a plurality of electrode fingers connected to the common terminal. The electrode fingers of the first and second electrodes are interdigitally overlapped with each other. An imaginary outline around the overlapped portion, in other words, the envelope of that portion, forms a main lobe and a plurality of side lobes on both sides of the main lobe. It has been found that, if the height of those of the first transducer's side lobes which are nearer the input end of the first transducer is chosen to be greater than the height of those side lobes nearer the output end, a substantially symmetrical impulse response may be obtained. A certain relationship must be maintained between the heights of corresponding side lobes on opposite sides of the main lobe.

BRIEF DESCRIPTION OF THE DRAWINGS

FIG. 5 is a schematic top view of a SAW filter according to the present invention;

FIG. 6 is a diagram used to explain the overlapping of electrode fingers of the filter shown in FIG. 5.

DESCRIPTION OF THE PREFERRED EMBODIMENT

Figure 7:
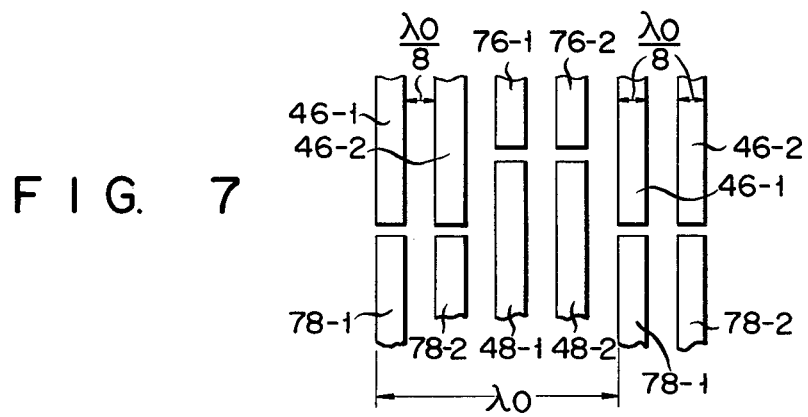
FIG. 7 is an enlarged partial view of the electrode fingers of the filter shown in FIG. 5.

FIGS. 5 and 7 show one embodiment of the VSB filter for a television broadcast transmitter which includes a SAW device made according to the present invention. The VSB filter was designed to have a central frequency $f_o$ of 19.5 MHz, a shape factor of 1.08, and a relative band width of 0.27. In FIG. 5, piezoelectric substrate 32 is made of $LiNbO_3$ which is widely used as a substrate for SAW devices because it has the largest electromechanical coupling coefficient (it converts electric signals into acoustic waves with high efficiency). On the right-hand side of the surface of substrate 32, an apodized transducer 34 is provided as an input transducer. On the left-hand side of the surface of substrate 32, a normal transducer 36 is provided as an output transducer.

Apodized transducer 34 is made up of first and second comb-like electrodes 38 and 40 each having a common terminal 42, 44 and electrode fingers 46, 48. These electrode fingers of electrodes 38 and 40 interdigitally overlap with each other and are arranged at substantially the same pitch. The lengths of the overlapped portions of the fingers are varied in accordance with their location along the direction of surface acoustic wave propagation, shown by the negative X axis. The envelope of the overlapped portions (the imaginary outline around the overlapped portions) is designed to form a main lobe 50 and side lobes 52, 54, 56, and 58. A high frequency television broadcasting signal is applied to common terminals 42 and 44 of apodized input transducer 34 from a signal source 60 within the television transmitter.

Normal output transducer 36 is made up of first and second comb-like electrodes 62 and 64 each having a common terminal 66 or 68 and electrode fingers 70 or 72. Electrode fingers 70, 72 of electrodes 62, 64 interdigitally overlap with each other, and the lengths of the overlapped portions of the fingers are uniform. An output signal is obtained from common terminals 64 and 68 and is supplied to a load 74 such as an antenna.

Figure 1:
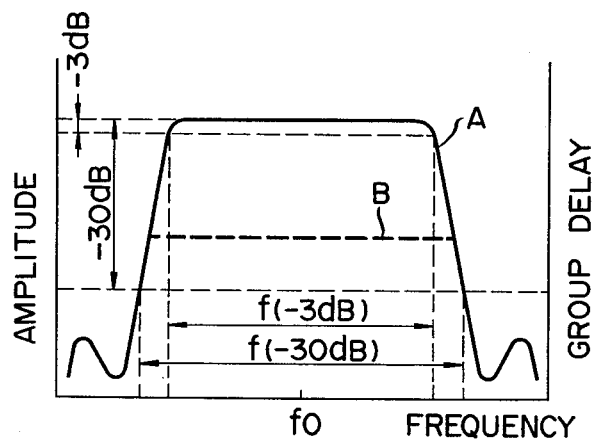
FIG. 1 is a diagram showing the desired transfer characteristic (curve A) and group delay time characteristic (curve B) of a high-performance filter manufactured in accordance with the present invention.

Side lobes 52, 54, 56, and 58 of transducer 34 are similar to those of the calculated inverse Fourier transform of the desired transfer characteristic (such as curve A of FIG. 1). As is shown in FIG. 5, the heights of the side lobes 52, 56 are greater than the heights of corresponding side lobes 54, 58. In other words, the maximum height of side lobe 52 or 56, both of which are located nearer the input end (right end in FIG. 5) of transducer 34, is greater than the height of the corresponding side lobe 54 or 58 which is located nearer the output end. The output end of transducer 34 in FIG. 5 is that end nearer the output transducer 36.) In general, the larger side lobes of an apodized transducer formed according to the present invention will be those side lobes farther from a second transducer formed on the same substrate. Therefore, in a filter using the apodized transducer as an output transducer rather than an input transducer, the larger side lobes will be nearer the output end and the smaller side lobes will be nearer the input end. This is more clearly shown in FIG. 12, discussed below.

FIG. 6 shows the relationship between the heights of the corresponding side lobes. For example, the second side lobes 56 and 58 on both sides of main lobe 50 have heights shown by $a_1$ and $a_2$ where $a_2$ is larger than $a_1$. The ratio $a_1/a_2$ is determined from an experimentally-derived parameter A according to the equation $$A = \frac{20 \log (a_1/a_2)}{f_o t}, \quad (2)$$

where $f_o$ is the design central frequency of the filter and t is the acoustic wave propagation time between two corresponding side lobes on opposite sides of the main lobe as shown in FIG. 6. (In this embodiment, parameter A was found to be 0.05.)

The exact method of determining the ratio $a_1/a_2$ is a follows. Once a desired transfer characteristic is established and its inverse Fourier transform has been calculated, a filter is constructed, in accordance with the conventional manufacturing technique outlined above, by overlapping electrode fingers to form an envelope matching the calculated inverse Fourier transform. This first filter will have a structure with symmetrical side lobes. Its impulse response is then measured by applying a pulse of radio-frequency energy to its input terminals and displaying the output on an oscilloscope.

Figure 4:
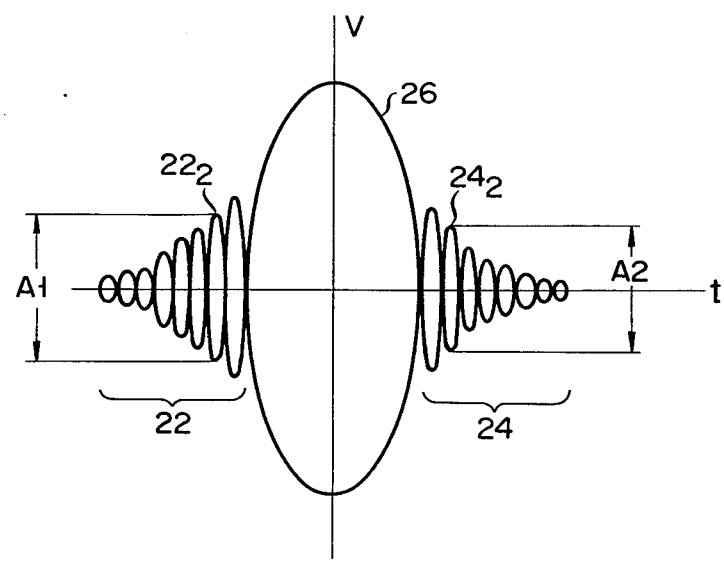
FIG. 4 is a diagram showing the envelope of the impulse response of the filter shown in FIG. 3, as observed on an oscilloscope.

As noted above in connection with FIG. 4, the impulse response shown on the oscilloscope will have a main lobe and asymmetrical side lobes. The maximum amplitudes of all corresponding side lobes on opposite sides of the main lobe are then measured, along with the time difference between the corresponding side lobes. For example, the second side lobe to the left of the main lobe may have a maximum amplitude A1, and the corresponding side lobe to the right of the main lobe (the second side lobe to the right) a maximum amplitude A2 (see FIG. 4). The surface wave propagation time between these lobes will be some time t, also measured on the oscilloscope. Parameter A is then calculated, using equation (2).

Next, a second filter is constructed, using the calculated parameter A, with lobes which are proportional in height to those measured on the oscilloscope. This second filter will have an impulse response of the desired form, that is, with side lobes of equal height (and therefore a flat transfer characteristic and group delay time characteristic). If, due to inaccuracies in construction or measurement, the impulse response is still incorrect, the ratios $a_1/a_2$ (the ratios between the heights of corresponding side lobes) are adjusted using equation (2) by varying parameter A from its calculated value and then constructing a new filter with side lobes of different heights. (This process may have to be repeated until a symmetrical impulse response is obtained.)

In FIG. 7 a more detailed structure of the apodized transducer is shown. Each electrode finger 46 or 48 shown in FIG. 5 is actually a split-type or paired electrode finger including two fingers 46-1, 46-2 or 48-1, 48-2. The electrode fingers constituting each pair are of equal length and are all $\frac{1}{8}$ wavelength wide, the wavelength being that of surface acoustic waves whose frequency is $f_o$. (The symbol $\lambda_o$ is used to designate this wavelength.) These fingers are also spaced $\frac{1}{8}$ wavelength from each other. Each electrode 38 or 40 has dummy electrode fingers 76-1, 76-2 or 78-1, 78-2. Dummy electrode fingers 76-1 and 76-2 are connected to common terminal 42 between electrode fingers 46. Dummy electrode fingers 78-1 and 78-2 are connected to common terminal 44 between electrode fingers 48. These dummy electrode fingers also consist of split-type or paired electrode fingers having the same length, a width of ⅛ wavelength, and a spacing of ⅛ wavelength. Therefore, all electrode fingers, including the dummy electrode fingers are arranged at a substantially equal pitch of ⅛ wavelength. Transducers having split-type electrode fingers are known in the art to reduce reflections of the surface wave at the electrode fingers. The dummy electrodes are also known in the art to provide uniform paths for the surface wave. The dummy fingers do not themselves generate acoustic waves and hence do not overlap with fingers of the opposite electrode. The SAW device mentioned above can be manufactured by well known lithographic techniques: first, Aluminum is vaporized onto substrate 32 to a thickness of 0.2 to 1.0 μm; then the electrode patterns are formed by photoetching.

Figure 8:
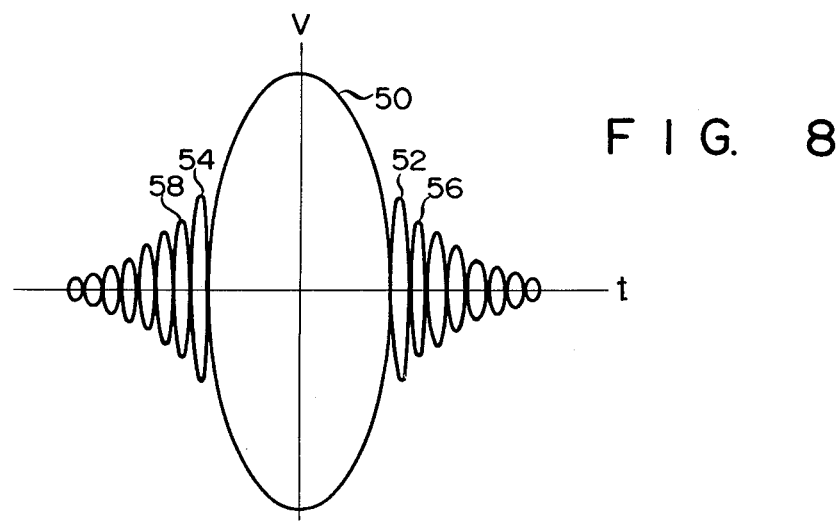
FIGS. 8 and 9 are diagrams showing impulse responses of the filter shown in FIG. 5, as measured by an oscilloscope at two different values of parameter A.
Figure 9:
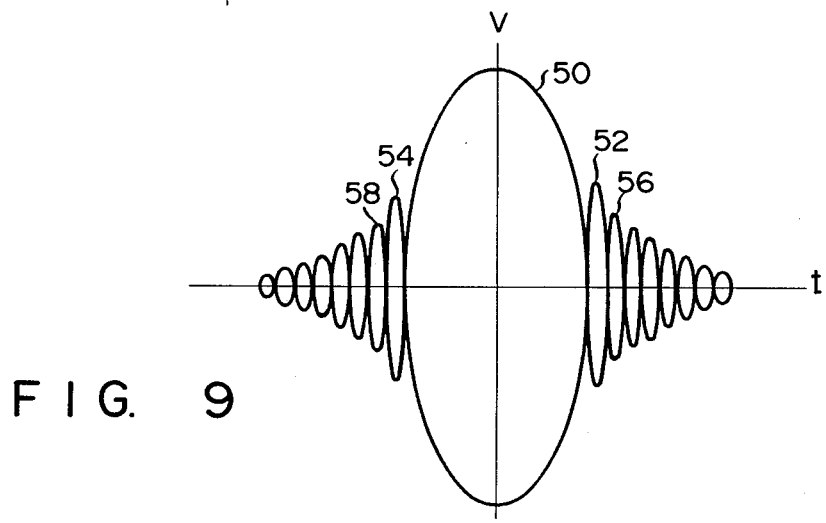

FIG. 8 shonws the impulse response of the filter of FIG. 5, which is a SAW filter made according to one embodiment of the invention. The impulse response is the waveform of the output signal which is observed by an oscilloscope when a high frequency pulse signal is supplied to the input transducer of the SAW filter. It is to be noted that the maximum amplitudes of the corresponding side lobes, 52 and 54 for example, are substantially the same. The same result was obtained when parameter A was selected as 0.1 instead of 0.05. On the other hand, when parameter A was chosen to be 0.2, the maximum amplitudes of the right hand side lobes 52 or 56 became larger than the amplitudes of the left hand side lobes 54 and 58, as shown in FIG. 9. It is therefore desirable to choose a value of A between about 0.02 and 0.2.

The rationale behind this design technique is related to the differential attenuation of two surface waves which have been produced by two corresponding side lobes. In manufacturing a high-performance SAW filter such a VSB SAW filter, with a large relative band width, low shape factor and flat group delay time characteristic, a large number of side lobes must be formed in the apodized transducer. Therefore, the horizontal length of the apodized transducer (along the direction of surface wave propagation, shown by the negative X axis in FIG. 5) is increased. The longer the apodized transducer becomes, the greater is the attenuation of surface waves during transmission through this transducer. Therefore, signals generated from right-hand side lobe 52 or 56 are attenuated more than signals generated from left-hand side lobe 54 or 58, since the former have to travel a longer path than the latter on the surface of the substrate. According to the present invention, the height of side lobes which are farther from the output transducer is greater than the height of corresponding side lobes located nearer the output transducer, so that the greater attenuation of signals generated from the farther side lobes is compensated by higher power. The impulse response measured is then substantially symmetrical. A symmetrical impulse response is an important factor in achieving a flat group delay time characteristic.

Figure 3:
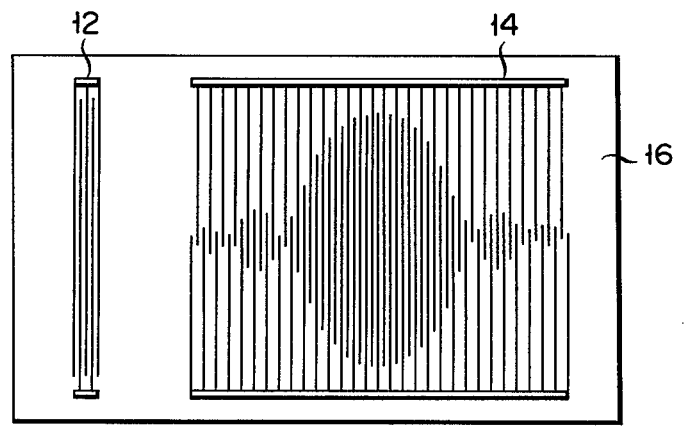
FIG. 3 is a schematic top view of a SAW filter made in accordance with the conventional design procedure.
Figure 10:
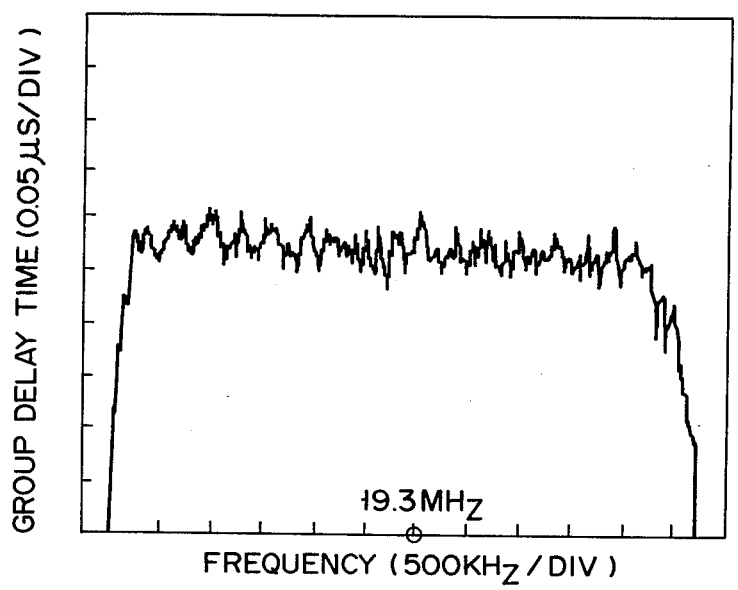
FIG. 10 is a diagram of the measured group delay times of the SAW filter shown in FIG. 5.
Figure 11:
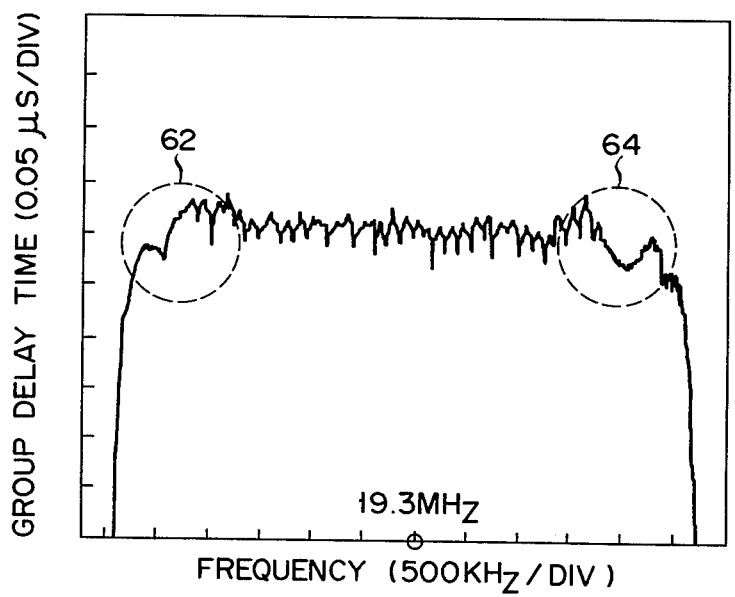
FIG. 11 is a diagram of the measured group delay times of the SAW filter shown in FIG. 3.

The group delay time characteristic of a SAW filter made in accordance with the present invention is flatter than the group delay time characteristic of a conventional SAW filter (shown in FIG. 3), as can be seen from a comparison of FIGS. 10 and 11. FIG. 10 is a diagram of measured group delay times of the SAW filter of FIG. 5. FIG. 11, on the other hand, which shows distortions 62 and 64 within the pass band, is a diagram of measured group delay times of the SAW filter of FIG. 3.

Figure 12:
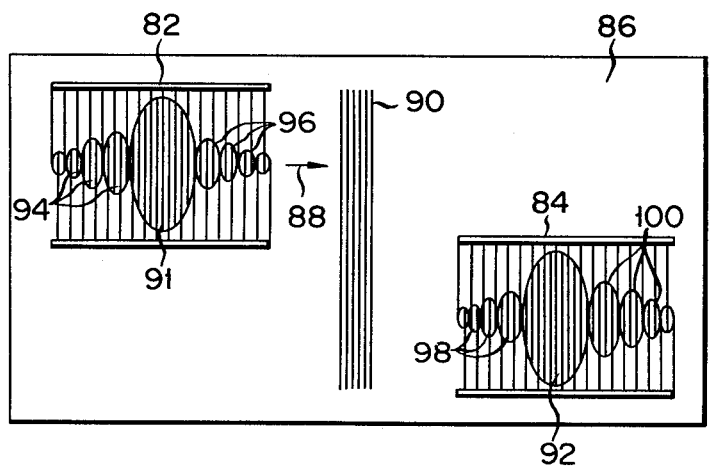
FIGS. 12 and 13 are top views of SAW filters showing other embodiments of the invention.

FIG. 12 shows another embodiment of the invention in which first and second apodized transducers 82 and 84 are provided on the surface of a piezoelectric substrate 86. Transducers 82 and 84 are displaced from each other in a direction perpendicular to the surface wave propagation direction, shown by arrow 88. A multi-strip coupler 90 is provided between first and second apodized transducers 82 and 84 to couple the surface wave from one transducer to the other. Input signals are supplied to first transducer 82, and output signals are taken from second transducer 84. The envelopes of overlapped portions of the electrode fingers of both transducers 82 and 84 are designed to form a main lobe 91 or 92 and side lobes 94, 96 or 98, 100. The height of side lobes 94 or 100, which are located farther from the other transducer, is greater than the height of side lobes 96 or 98 located nearer the other transducer.

Figure 13:
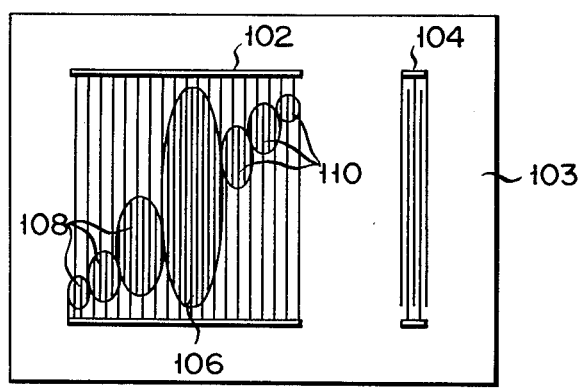

FIG. 13 shows still another embodiment of the invention in which tilted apodized transducer 102 is provided on a substrate 103 as an input transducer. A normal transducer 104, spaced from tilted apodized transducer 102 on the substrate, is an output transducer. The tilted transducer 102 has first and second comb-like electrodes each having a common terminal and parallel electrode fingers connected to the common terminal. The fingers of the first and second electrodes are interdigitally overlapped to some extent with each other so that, in the areas of overlap, adjacent fingers are connected to opposite terminals or electrodes. An imaginary outline around the overlapped portions of the active electrode fingers (the pattern or envelope of the overlapped portions) forms a plurality of lobes including a main lobe 106 and a plurality of side lobes 108, 110 aligned at an angle (tilted) from the direction of propagation of the surface acoustic wave and from the direction of the electrode fingers. The normal transducer 104 also has first and second electrodes, each with a common terminal and parallel electrode fingers interdigitally overlapping with each other. The overlapped portions of the electrode fingers in this case, however, do not form lobes but are all of equal length (uniform overlapping). The height of side lobes 108 which are located farther from normal transducer 104 is greater than the height of corresponding side lobes 110 which are nearer the normal transducer 104.

To summarize, the design technique according to the present invention is as follows:

(1) Establish a desired transfer characteristic, for example as shown in FIG. 1. The chosen transfer characteristic may have a relative band width greater than 0.2 and a shape factor less than 1.5 because of the advantages of the present invention.

Figure 2:
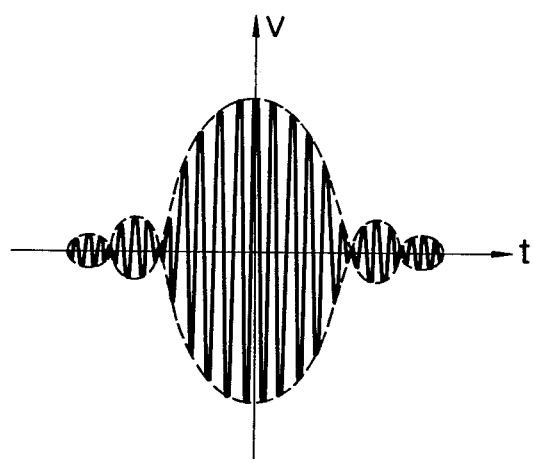
FIG. 2 is a diagram of the impulse response calculated mathematically from the transfer characteristic shown in FIG. 1.

(2) Determine the inverse Fourier transform of this transfer characteristic, i.e., the desired impulse response of the filter, for example as shown in FIG. 2. It will be noted that corresponding side lobes of the desired impulse response, on opposite sides of the main lobe, have equal maximum amplitudes.

(3) Construct a test filter, arranging the electrodes in the form of the desired impulse response. The side lobes will be symmetrical.

(4) Observe the impulse response of the filter so constructed, measuring the maximum heights of the side lobes and the time differences between them.

(5) Construct a new filter, with side lobes whose heights are related by the equation $$A = \frac{20 \log (a_1/a_2)}{f_o t},$$

using the measurements obtained in step (4). The impulse response of this new filter should have symmetrical side lobes.

Although illustrative embodiments of the invention have been described in detail with reference to the accompanying drawings, it is to be understood that the invention is not limited to those precise embodiments and that various changes and modifications may be effected therein by one skilled in the art without departing from the scope or spirit of the invention.

I claim:

1. In a surface acoustic wave filter comprising an apodized transducer spaced from a second transducer on a piezoelectric substrate, said apodized transducer comprising comb-like electrodes interdigitally overlapped to form an envelope having a main lobe and at least one pair of corresponding side lobes on opposite sides of said main lobe, the improvement comprising said side lobes in each pair of corresponding side lobes being of unequal height, said side lobe of each pair of corresponding side lobes nearer said second transducer having a height sufficiently smaller than the height of the other of said corresponding side lobes so that said filter has a substantially symmetrical impulse response.

2. In a surface acoustic wave filter comprising an apodized transducer spaced from a second transducer on a piezoelectric substrate, said apodized transducer comprising comb-like electrodes interdigitally overlapped to form an envelope having a main lobe and at least one pair of corresponding side lobes on opposite sides of said main lobe, the improvement comprising said side lobes in each pair of corresponding side lobes being of unequal height, said side lobe of each pair of corresponding side lobes nearer said second transducer having a height smaller than the height of the other of said corresponding side lobes, the difference in height being defined by the following mathematical relationship:

$$A = \frac{20 \log (a_1/a_2)}{f_o t},$$

where $a_1$ represents the height of said side lobe nearer said second transducer, $a_2$ represents the height of the corresponding side lobe farther from said second transducer, and A is a positive number.

3. A surface acoustic wave filter as claimed in claim 2 wherein said apodized transducer comprises an input transducer to convert an input signal to a surface acoustic wave and said second transducer comprises an output transducer to convert the surface acoustic wave to an output signal.

4. A surface acoustic wave filter as claimed in claim 2 wherein said comb-like electrodes comprise substantially equally spaced electrode fingers.

5. A surface acoustic wave filter as claimed in claim 4 wherein said electrode fingers include dummy electrode fingers.

6. A surface acoustic wave filter as claimed in claim 4 wherein said electrode fingers comprise paired electrode fingers.

7. A surface acoustic wave filter as claimed in claim 1, 2, 3, 4, 5, or 6 wherein said second transducer comprises a normal interdigital transducer.

8. A surface acoustic wave filter as claimed in claim 1, 2, 3, 4, 5, or 6 wherein said second transducer comprises a second apodized transducer having lobes of substantially the same height as said apodized transducer.

9. A surface acoustic wave filter as claimed in claim 1, 2, 3, 4, 5, or 6 having a transfer characteristic with a shape factor of 1.5 or less and a relative band width of 0.2 or more.

10. A method of making a high-performance surface acoustic wave filter having an apodized transducer and a second transducer, said apodized transducer comprising comb-like electrodes interdigitally overlapped to form an envelope having a main lobe and at least one pair of corresponding side lobes on opposite sides of the main lobe, said method comprising the step of making the side lobe of each pair of corresponding side lobes nearer said second transducer of sufficiently smaller height than the height of the other of the corresponding side lobes so that the filter has a substantially symmetrical impulse response.

11. A method of producing a high-performance surface acoustic wave filter as claimed in claim 10 wherein said step of making each side lobe nearer the second transducer of sufficiently smaller height than the corresponding side lobe farther from the second transducer comprises the steps of:

establishing a desired transfer characteristic for the surface acoustic wave filter;

calculating the inverse Fourier transform of the desired transfer characteristic;

constructing a test filter having an apodized transducer with an envelope in the form of the inverse Fourier transform;

measuring the amplitudes and time differences of corresponding side lobes of an impulse response of the test filter;

calculating a parameter A from the measured amplitudes and time differences according to the following mathematical relationship:

$$A = \frac{20 \log (a_1/a_2)}{f_o t},$$

where $a_1$ represents the height of one of said side lobes nearer said second transducer, and $a_2$ represents the height of the corresponding side lobe farther from said second transducer; and making the sizes of side lobes in each pair of corresponding side lobes of the apodized transducer in the surface acoustic wave filter of unequal height, the difference in height being defined by the calculated parameter A and the mathematical relationship.

* * * * *